(12) United States Patent
Yoshitake et al.

(10) Patent No.: US 8,258,502 B2
(45) Date of Patent: Sep. 4, 2012

(54) LIGHT EMITTING DEVICE ENCAPSULATED WITH SILICONES AND CURABLE SILICONE COMPOSITIONS FOR PREPARING THE SILICONES

(75) Inventors: Makoto Yoshitake, Funabashi (JP);
Masashi Murakami, Fukuyama (JP);
Yoshitsugu Morita, Ichihara (JP);
Tomoko Kato, Ichihara (JP); Hiroji Enami, Ichihara (JP); Masayoshi Terada, Ichihara (JP); Brian Harkness, Midland, MI (US); Tammy Cheng, Flushing, NY (US); Michelle Cummings, Midland, MI (US); Ann Norris, Midland, MI (US); Malinda Howell, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 391 days.

(21) Appl. No.: 12/223,133

(22) PCT Filed: Feb. 1, 2007

(86) PCT No.: PCT/US2007/002966
§ 371 (c)(1),
(2), (4) Date: Jun. 10, 2010

(87) PCT Pub. No.: WO2007/100445
PCT Pub. Date: Sep. 7, 2007

(65) Prior Publication Data
US 2010/0276721 A1    Nov. 4, 2010

Related U.S. Application Data

(60) Provisional application No. 60/776,575, filed on Feb. 24, 2006.

(51) Int. Cl.
*H01L 35/24* (2006.01)

(52) U.S. Cl. ............ 257/40; 257/99; 257/E51.001
(58) Field of Classification Search ............ 257/40, 257/99, E51.001
See application file for complete search history.

(56) References Cited

U.S. PATENT DOCUMENTS

| 3,159,601 A | 12/1964 | Ashby et al. |
| 3,220,972 A | 11/1965 | Lamoreaux et al. |
| 3,296,291 A | 1/1967 | Chalk et al. |
| 3,419,593 A | 12/1968 | Willing et al. |
| 3,445,420 A | 5/1969 | Kookootsedes et al. |

(Continued)

FOREIGN PATENT DOCUMENTS

DE    100 52 068 B4    9/2004

(Continued)

OTHER PUBLICATIONS

Seisuki, Tomita, "Pressure-Sensitive Sensor", Patent Abstracts of Japan, Published Apr. 21, 1989.

(Continued)

*Primary Examiner* — Anthony Ho
(74) *Attorney, Agent, or Firm* — Erika Takeuchi (57) ABSTRACT

A composition includes: (I) an alkenyl functional, phenyl-containing polyorganosiloxane, an Si—H functional phenyl-containing polyorganosiloxane, or a combination thereof; (II) a hydrogendiorganosiloxy terminated oligodiphenylsiloxane having specific molecular weight, an alkenyl-functional, diorganosiloxy-terminated oligodiphenylsiloxane having specific molecular weight, or a combination thereof; and (III) a hydrosilylation catalyst. A light emitting device is made by applying the composition onto a light source followed by curing. The composition provides a cured material with mechanical properties suited for use as an encapsulant for a light emitting device.

19 Claims, 1 Drawing Sheet

U.S. PATENT DOCUMENTS

| | | | |
|---|---|---|---|
| 3,516,946 A | 6/1970 | Modic et al. |
| 3,814,730 A | 6/1974 | Karstedt et al. |
| 3,915,924 A | 10/1975 | Wright |
| 3,974,122 A | 8/1976 | Sato et al. |
| 3,989,667 A | 11/1976 | Lee et al. |
| 3,989,668 A | 11/1976 | Lee et al. |
| 4,085,084 A | 4/1978 | Merrill |
| 4,087,585 A | 5/1978 | Schulz |
| 4,584,361 A | 4/1986 | Janik et al. |
| 4,780,510 A | 10/1988 | Uemiya et al. |
| 4,784,879 A | 11/1988 | Lee et al. |
| 5,036,117 A | 7/1991 | Chung et al. |
| 5,116,369 A | 5/1992 | Kushibiki et al. |
| 5,175,325 A | 12/1992 | Brown et al. |
| 5,194,649 A | 3/1993 | Okawa |
| 5,217,811 A | 6/1993 | Filas et al. |
| 5,233,007 A | 8/1993 | Yang |
| 5,239,035 A | 8/1993 | Maxson |
| 5,248,715 A | 9/1993 | Gray et al. |
| 5,266,352 A | 11/1993 | Filas et al. |
| 5,272,013 A | 12/1993 | Raleigh et al. |
| 5,314,979 A | 5/1994 | Okinoshima et al. |
| 5,326,970 A | 7/1994 | Bayless |
| 5,376,694 A | 12/1994 | Christ et al. |
| 5,384,383 A | 1/1995 | Legrow et al. |
| 5,420,213 A | 5/1995 | Yang et al. |
| 5,444,106 A | 8/1995 | Zhou et al. |
| 5,494,946 A | 2/1996 | Christ et al. |
| 5,512,609 A | 4/1996 | Yang |
| 5,541,278 A | 7/1996 | Raleigh et al. |
| 5,594,424 A | 1/1997 | Louy et al. |
| 5,623,029 A | 4/1997 | Yang |
| 5,739,948 A | 4/1998 | Kushibiki et al. |
| 5,744,507 A | 4/1998 | Angell et al. |
| 5,763,095 A | 6/1998 | Sano et al. |
| 5,955,542 A | 9/1999 | Davis et al. |
| 6,066,172 A | 5/2000 | Huo et al. |
| 6,169,142 B1 | 1/2001 | Nakano et al. |
| 6,174,079 B1 | 1/2001 | Buard |
| 6,174,983 B1 | 1/2001 | Czech et al. |
| 6,274,924 B1 | 8/2001 | Carey et al. |
| 6,277,147 B1 | 8/2001 | Christ et al. |
| 6,361,561 B1 | 3/2002 | Huo et al. |
| 6,399,734 B1 | 6/2002 | Hodd et al. |
| 6,483,981 B1 | 11/2002 | Krahn et al. |
| 6,509,423 B1 | 1/2003 | Zhu et al. |
| 6,531,169 B2 | 3/2003 | Best et al. |
| 6,568,822 B2 | 5/2003 | Boyd et al. |
| 6,613,343 B2 | 9/2003 | Dillingham et al. |
| 6,645,246 B1 | 11/2003 | Weinschenk et al. |
| 6,727,303 B2 | 4/2004 | Ono et al. |
| 6,737,496 B2 | 5/2004 | Hodd et al. |
| 6,777,522 B2 | 8/2004 | Lai et al. |
| 6,798,792 B2 | 9/2004 | Itoh |
| 6,805,712 B2 | 10/2004 | Lai et al. |
| 6,806,509 B2 | 10/2004 | Yoshino et al. |
| 6,815,520 B2 | 11/2004 | Yoneda et al. |
| 6,844,414 B2 | 1/2005 | Lai et al. |
| 6,864,341 B2 | 3/2005 | Lai et al. |
| 6,864,342 B2 | 3/2005 | Lai et al. |
| 6,900,923 B2 | 5/2005 | Chakrapani et al. |
| 6,905,904 B2 | 6/2005 | Gardner et al. |
| 6,907,176 B2 | 6/2005 | Gardner et al. |
| 6,951,914 B2 | 10/2005 | Lai et al. |
| 7,041,631 B2 | 5/2006 | Ochs et al. |
| 7,066,955 B2 | 6/2006 | Lowery |
| 7,074,873 B2 | 7/2006 | Lai et al. |
| 7,086,765 B2 | 8/2006 | Wehner |
| 7,098,288 B2 | 8/2006 | Lai et al. |
| 7,116,484 B2 | 10/2006 | Nemoto et al. |
| 7,132,492 B2 | 11/2006 | Lai et al. |
| 7,160,972 B2 | 1/2007 | Young et al. |
| 7,217,778 B2 | 5/2007 | Verbruggen et al. |
| 7,242,526 B2 | 7/2007 | Nemoto et al. |
| 7,283,715 B2 | 10/2007 | Kodama et al. |
| 7,344,902 B2 | 3/2008 | Basin et al. |
| 2002/0055778 A1 | 5/2002 | Huo et al. |
| 2002/0169505 A1 | 11/2002 | Jethmalani et al. |
| 2004/0023822 A1 | 2/2004 | Ochs et al. |
| 2004/0075100 A1 | 4/2004 | Bogner et al. |
| 2004/0116640 A1 | 6/2004 | Miyoshi |
| 2004/0198924 A1 | 10/2004 | Young et al. |
| 2004/0236057 A1 | 11/2004 | Chevalier et al. |
| 2004/0257191 A1 | 12/2004 | Muller |
| 2005/0038219 A1 | 2/2005 | Lai et al. |
| 2006/0001036 A1 | 1/2006 | Jacob et al. |
| 2007/0112147 A1 | 5/2007 | Morita et al. |
| 2008/0090332 A1 | 4/2008 | Cheng et al. |

FOREIGN PATENT DOCUMENTS

| | | |
|---|---|---|
| EP | 0 493 791 A1 | 7/1992 |
| EP | 0 497 349 B1 | 8/1992 |
| EP | 0 585 046 A2 | 3/1994 |
| EP | 0 764 703 A2 | 3/1997 |
| GB | 2 073 765 A | 3/1980 |
| WO | WO 01/74554 A2 | 10/2001 |
| WO | WO 03/066707 A1 | 8/2003 |
| WO | WO 2004/037927 A1 | 5/2004 |
| WO | WO 2006/033375 A1 | 3/2006 |
| WO | WO 2006/045320 A2 | 5/2006 |
| WO | WO 2006/127100 A1 | 11/2006 |
| WO | WO 2007/086987 A1 | 8/2007 |
| WO | WO 2007/100445 A2 | 9/2007 |

OTHER PUBLICATIONS

Norris, et. al., "Silicone Polymers for Optical Films and Devices," Nonlinear Optics of Organic Materials II, 2002, pp. 79-86, vol. 4798.

Su, Kai, et. al., "Siloxane Materials for Optical Applications," Materials and Nanotechnologies, 2005, pp. 60291C-1-60291C-8, vol. 60291C.

Norris, Ann W., et. al., "Novel Silicone Materials for LED Packaging," Fifth International Conference on Solid State Lighting, 2005, pp. 594115-1-594115-7, vol. 5941.

US 8,258,502 B2

LIGHT EMITTING DEVICE ENCAPSULATED WITH SILICONES AND CURABLE SILICONE COMPOSITIONS FOR PREPARING THE SILICONES

CROSS REFERENCE TO RELATED APPLICATIONS

This application claims the benefit of U.S. Provisional Patent Application No. 60/776,575 filed 24 Feb. 2006 and U.S. Provisional Patent Application No. 60/759,501 filed on 17 Jan. 2006 under 35 U.S.C. §119(e). U.S. Provisional Patent Application No. 60/776,575 and U.S. Provisional Patent Application No. 60/759,501 are hereby incorporated by reference.

TECHNICAL FIELD

This invention relates to curable silicone compositions and light emitting devices encapsulated with silicone products prepared by curing these compositions. More particularly, this invention relates to hydrosilylation-curable compositions that cure to form silicone products having optical clarity, high refractive index, resistance to high temperature, and high mechanical strength. This invention further relates to reliable light emitting devices encapsulated with the silicone products.

BACKGROUND

Curable silicone compositions giving optically clear silicone products are frequently used in light emitting devices for properties such as their thermal and light resistance. Such curable silicone compositions may have advantages of high reliability over conventional materials such as epoxy resin materials, which may suffer from the drawback of discoloration by the action of heat and light generated from the light source.

However, mechanical and adhesion properties of optically clear silicone products may be poorer than epoxy resins and filled silicones. These may cause fracture or delamination of the silicone product, resulting in a drop of the light output. One proposed approach to address this is to use a silicone resin compatible to the silicone product as a toughening agent. Another approach is to incorporate organic polymer components or functionalities into the silicone polymer structure, however, such modifications of silicone may be unsuitable for thermal and light resistance.

SUMMARY OF THE INVENTION

This invention relates to a composition prepared by mixing components comprising:
(I) an alkenyl functional, phenyl-containing polyorganosiloxane, an Si—H functional phenyl-containing polyorganosiloxane, or a combination thereof;
(II) a hydrogendiorganosiloxy terminated oligodiphenylsiloxane having specific molecular weight, an alkenyl-functional, diorganosiloxy-terminated oligodiphenylsiloxane having specific molecular weight, or a combination thereof; and
(III) a hydrosilylation catalyst.
At least one of components (I) and (II) contains alkenyl groups. At least one of components (I) and (II) contains silicon bonded hydrogen atoms.

This invention further relates to a light emitting device encapsulated or coated with a silicone product prepared by curing the curable silicone composition.

DETAILED DESCRIPTION OF THE INVENTION

All amounts, ratios, and percentages are by weight unless otherwise indicated. The following is a list of definitions, as used herein.

DEFINITIONS AND USAGE OF TERMS

"Light emitting device" means a device for lighting. Light emitting device includes a light emitting diode (LED) in which a semiconductor chip mounted on a substrate as a light emitting element is encapsulated with an optically transmissive silicone product. Such encapsulation helps to protect against mechanical shock and intrusion of dust or moisture. It also serves at the same time as a medium which improves index matching along the light path and supports propagation of a light signal through its bulk without significant reflection or attenuation of the signal. The medium may be transparent or contain a phosphor or other additive to modify transparency. Light emitting device also includes devices or system structures in which the other light emitting sources such as a fluorescent lamp is used.

"Delamination" means the tendency of the silicone product to peel off from the light emitting element or the other materials in the light emitting device.

"Fracture" means the tendency of the encapsulant to show deformation or cracking, or both, in the light emitting devices.

The abbreviation "Me" means methyl group.
The abbreviation "Ph" means phenyl group.
The abbreviation "Vi" means vinyl group.
The abbreviation "Hex" means hexenyl group.
"Pa·s" means Pascal seconds.
The abbreviation "ppm" means parts per million.

Component (I)

Component (I) may comprise an alkenyl functional, phenyl-containing polyorganosiloxane having an average compositional formula given as $R^1_a R^2_b SiO_{(4-a-b)/2}$. The alkenyl functional, phenyl-containing polyorganosiloxane may have a linear, branched, cyclic, or resinous siloxane structure. The alkenyl functional, phenyl-containing polyorganosiloxane may be a single component or a combination comprising more than one alkenyl functional, phenyl-containing polyorganosiloxane. Component (I) may comprise a branched alkenyl functional, phenyl-containing polyorganosiloxane and a linear alkenyl-functional, phenyl-containing polyorganosiloxane. The relative amount of branched alkenyl functional, phenyl-containing polyorganosiloxane may range from 0.01% to 35% based on the weight of the composition and alternatively 1% to 15%. Each $R^1$ is independently an alkenyl group having 2 to 12 carbon atoms. The alkenyl groups are exemplified by, but not limited to, vinyl, allyl, butenyl, and hexenyl. The alkenyl groups in the alkenyl functional, phenyl-containing polyorganosiloxane may be located at monovalent, bivalent, and trivalent siloxane units. Each $R^2$ is independently a methyl group or a phenyl group. At least 30 mol % to 90 mol % of $R^2$ may be phenyl groups. Without wishing to be bound by theory, it is thought that the amount of phenyl groups may be selected to improve compatibility of components (I) and (II). The methyl and phenyl groups in component (I) may be located at monovalent, bivalent, and trivalent siloxane units. In the formula, a and b are positive numbers satisfying following equations: a+b=1 to 2.2 and a/(a+b)=0.001 to 0.05. Component (I) may comprise polyorganosiloxanes such as
ViMe$_2$SiO(SiMePhO)$_n$SiMe$_2$Vi,
ViMe$_2$SiO(SiPh$_2$O)$_n$SiMe$_2$Vi,
ViMe$_2$SiO(SiMe$_2$O)$_n$(SiMePhO)$_m$SiMe$_2$Vi,
ViMe$_2$SiO(SiMe$_2$O)$_n$(SiPh$_2$O)$_m$SiMe$_2$Vi,
HexMe$_2$SiO(SiMePhO)$_n$SiMe$_2$Hex,
HexMe$_2$SiO(SiPh$_2$O)$_n$SiMe$_2$Hex,
HexMe$_2$SiO(SiMe$_2$O)$_n$(SiMePhO)$_m$SiMe$_2$Hex,
HexMe$_2$SiO(SiMe$_2$O)$_n$(SiPh$_2$O)$_m$SiMe$_2$Hex,
ViMePhSiO(SiMePhO)$_n$SiMePhVi,
ViMePhSiO(SiPh$_2$O)$_n$SiMePhVi,
ViMePhSiO(SiMe$_2$O)$_n$(SiMePhO)$_m$SiMePhVi,
ViMePhSiO(SiMe$_2$O)$_n$(SiPh$_2$O)$_m$SiMePhVi,
ViMe$_2$SiO(SiMePhO)$_n$(SiMeViO)$_n$SiMe$_2$Vi,
ViMe$_2$SiO(SiMe$_2$O)$_n$(SiMePhO)$_m$(SiMeViO)$_1$SiMe$_2$Vi,
ViMe$_2$SiO(SiMe$_2$O)$_n$(SiPh$_2$O)$_m$(SiMeViO)$_1$SiMe$_2$Vi,
ViMePhSiO(SiMePhO)$_n$(SiMeViO)$_m$SiMePhVi,
ViMePhSiO(SiMe$_2$O)$_n$(SiMePhO)$_m$(SiMeViO)$_1$SiMePhVi,
ViMePhSiO(SiMe$_2$O)$_n$(SiPh$_2$O)$_m$(SiMeViO)$_1$SiMePhVi,
Me$_3$SiO(SiMePhO)$_n$(SiMeViO)$_m$SiMe$_3$,
Me$_3$SiO(SiMe$_2$O)$_n$(SiMePhO)$_m$(SiMeViO)$_1$SiMe$_3$,
Me$_3$SiO(SiMe$_2$O)$_n$(SiPh$_2$O)$_m$(SiMeViO)$_1$SiMe$_3$,
Me$_3$SiO(SiMePhO)$_n$(SiMeHexO)$_m$SiMe$_3$,
Me$_3$SiO(SiMe$_2$O)$_n$(SiMePhO)$_m$(SiMeHexO)$_1$SiMe$_3$,
Me$_3$SiO(SiMe$_2$O)$_n$(SiPh$_2$O)$_m$(SiMeHexO)$_1$SiMe$_3$,
(ViMe$_2$SiO$_{1/2}$)$_p$(PhSiO$_{3/2}$)$_q$,
(ViMe$_2$SiO$_{1/2}$)$_p$(Me$_2$SiO$_{2/2}$)$_q$(PhSiO$_{3/2}$)$_r$,
(ViMe$_2$SiO$_{1/2}$)$_p$(MePhSiO$_{2/2}$)$_q$(PhSiO$_{3/2}$)$_r$,
(ViMe$_2$SiO$_{1/2}$)$_p$(Ph$_2$SiO$_{2/2}$)$_q$(PhSiO$_{3/2}$)$_r$,
(ViMe$_2$SiO$_{1/2}$)$_p$(MeSiO$_{3/2}$)$_q$(PhSiO$_{3/2}$)$_r$,
(ViMe$_2$SiO$_{1/2}$)$_p$(PhSiO$_{3/2}$)$_q$(SiO$_{4/2}$)$_r$,
(HexMePhSiO$_{1/2}$)$_p$(PhSiO$_{3/2}$)$_q$,
(ViMePhSiO$_{1/2}$)$_p$(PhSiO$_{3/2}$)$_q$,
(ViMePhSiO$_{1/2}$)$_p$(Me$_2$SiO$_{2/2}$)$_q$(PhSiO$_{3/2}$)$_r$,
(ViMePhSiO$_{1/2}$)$_p$(MePhSiO$_{2/2}$)$_q$(PhSiO$_{3/2}$)$_r$,
(ViMePhSiO$_{1/2}$)$_p$(Ph$_2$SiO$_{2/2}$)$_q$(PhSiO$_{3/2}$)$_r$,
(ViMePhSiO$_{1/2}$)$_p$(MeSiO$_{3/2}$)$_q$(PhSiO$_{3/2}$)$_r$,
(ViMePhSiO$_{1/2}$)$_p$(PhSiO$_{3/2}$)$_q$(SiO$_{4/2}$)$_r$,
(ViMePhSiO$_{1/2}$)$_p$(PhSiO$_{3/2}$)$_q$,
(HexMe$_2$SiO$_{1/2}$)$_p$(PhSiO$_{3/2}$)$_q$,
(HexMe$_2$SiO$_{1/2}$)$_p$(Me$_2$SiO$_{2/2}$)$_q$(PhSiO$_{3/2}$)$_r$,
(HexMe$_2$SiO$_{1/2}$)$_p$(MePhSiO$_{2/2}$)$_q$(PhSiO$_{3/2}$)$_r$,
(HexMe$_2$SiO$_{1/2}$)$_p$(Ph$_2$SiO$_{2/2}$)$_q$(PhSiO$_{3/2}$)$_r$,
(HexMe$_2$SiO$_{1/2}$)$_p$(MeSiO$_{3/2}$)$_q$(PhSiO$_{3/2}$)$_r$,
(Me$_3$SiO$_{1/2}$)$_p$(MeViSiO$_{2/2}$)$_q$(PhSiO$_{3/2}$)$_r$,
(Me$_3$SiO$_{1/2}$)$_p$(ViSiO$_{3/2}$)$_q$(PhSiO$_{3/2}$)$_r$,
(Me$_3$SiO$_{1/2}$)$_p$(MeViSiO$_{2/2}$)$_q$(PhSiO$_{3/2}$)$_r$,
(ViMeSiO$_{2/2}$)$_p$(Me$_2$SiO$_{2/2}$)$_q$(PhSiO$_{3/2}$)$_r$,
(ViMeSiO$_{2/2}$)$_p$(MePhSiO$_{2/2}$)$_q$(PhSiO$_{3/2}$)$_r$,
(ViMeSiO$_{2/2}$)$_p$(Ph$_2$SiO$_{2/2}$)$_q$(PhSiO$_{3/2}$)$_r$,
(ViMeSiO$_{2/2}$)$_p$(MeSiO$_{3/2}$)$_q$(PhSiO$_{3/2}$)$_r$,
(ViMeSiO$_{2/2}$)$_p$(PhSiO$_{3/2}$)$_q$(SiO$_{4/2}$)$_r$,
(ViMeSiO$_{2/2}$)$_p$(Me$_2$SiO$_{2/2}$)$_q$(PhSiO$_{3/2}$)$_r$,
(ViMeSiO$_{2/2}$)$_p$(MePhSiO$_{2/2}$)$_q$(PhSiO$_{3/2}$)$_r$,
(HexMeSiO$_{2/2}$)$_p$(Ph$_2$SiO$_{2/2}$)$_q$(PhSiO$_{3/2}$)$_r$,
(HexMeSiO$_{2/2}$)$_p$(MeSiO$_{3/2}$)$_q$(PhSiO$_{3/2}$)$_r$,
(HexMeSiO$_{2/2}$)$_p$(PhSiO$_{3/2}$)$_q$(SiO$_{4/2}$)$_r$, or
a combination thereof.

In the formulas, n, m, l are positive numbers less than 200 that mean the average number of each monomer unit in the polymer, and p, q, r, and s mean the average mol percentages of each monomer unit in the total average compositions.

Alternatively, component (I) may comprise an Si—H functional phenyl-containing polyorganosiloxane having an average compositional formula given as $H_aR^2{}_bSiO_{(4-a-b)/2}$, where $R^2$, a, and b are as described above. The Si—H functional phenyl-containing polyorganosiloxane may have a linear, branched, or cyclic siloxane structure. The Si—H functional phenyl-containing polyorganosiloxane may be a single component or a combination comprising more than one SiH functional phenyl-containing polyorganosiloxane. Component (I) may comprise polyorganosiloxanes such as
HMe$_2$SiO(SiMePhO)$_n$SiMe$_2$H,
HMe$_2$SiO(SiPh$_2$O)$_n$SiMe$_2$H,
HMe$_2$SiO(SiMe$_2$O)$_n$(SiMePhO)$_m$SiMe$_2$H,
HMe$_2$SiO(SiMe$_2$O)$_n$(SiPh$_2$O)$_m$SiMe$_2$H,
HMe$_2$SiO(SiMePhO)$_n$SiMe$_2$H,
HMe$_2$SiO(SiPh$_2$O)$_n$SiMe$_2$H,
HMe$_2$SiO(SiMe$_2$O)$_n$(SiMePhO)$_m$SiMe$_2$H,
HMe$_2$SiO(SiMe$_2$O)$_n$(SiPh$_2$O)$_m$SiMe$_2$H,
HMePhSiO(SiMePhO)$_n$SiMePhH,
HMePhSiO(SiPh$_2$O)$_n$SiMePhH,
HMePhSiO(SiMe$_2$O)$_n$(SiMePhO)$_m$SiMePhH,
HMePhSiO(SiMe$_2$O)$_n$(SiPh$_2$O)$_m$SiMePhH,
HMe$_2$SiO(SiMePhO)$_n$(SiMeHO)$_m$SiMe$_2$H,
HMe$_2$SiO(SiMe$_2$O)$_n$(SiMePhO)$_m$(SiMeHO)$_1$SiMe$_2$H,
HMe$_2$SiO(SiMe$_2$O)$_n$(SiPh$_2$O)$_m$(SiMeHO)$_1$SiMe$_2$H,
HMePhSiO(SiMePhO)$_n$(SiMeHO)$_m$SiMePhH,
HMePhSiO(SiMe$_2$O)$_n$(SiMePhO)$_m$(SiMeHO)$_1$SiMePhH,
HMePhSiO(SiMe$_2$O)$_n$(SiPh$_2$O)$_m$(SiMeHO)$_1$SiMePhH,
Me$_3$SiO(SiMePhO)$_n$(SiMeHO)$_m$SiMe$_3$,
Me$_3$SiO(SiMe$_2$O)$_n$(SiMePhO)$_m$(SiMeHO)$_1$SiMe$_3$,
Me$_3$SiO(SiMe$_2$O)$_n$(SiPh$_2$O)$_m$(SiMeHO)$_1$SiMe$_3$,
Me$_3$SiO(SiMePhO)$_n$(SiMeHO)$_m$SiMe$_3$,
Me$_3$SiO(SiMe$_2$O)$_n$(SiMePhO)$_m$(SiMeHO)$_1$SiMe$_3$,
Me$_3$SiO(SiMe$_2$O)$_n$(SiPh$_2$O)$_m$(SiMeHO)$_1$SiMe$_3$,
(HMe$_2$SiO$_{1/2}$)$_p$(PhSiO$_{3/2}$)$_q$,
(HMe$_2$SiO$_{1/2}$)$_p$(Me$_2$SiO$_{2/2}$)$_q$(PhSiO$_{3/2}$)$_r$,
(HMe$_2$SiO$_{1/2}$)$_p$(MePhSiO$_{2/2}$)$_q$(PhSiO$_{3/2}$)$_r$,
(HMe$_2$SiO$_{1/2}$)$_p$(Ph$_2$SiO$_{2/2}$)$_q$(PhSiO$_{3/2}$)$_r$,
(HMe$_2$SiO$_{1/2}$)$_p$(MeSiO$_{3/2}$)$_q$(PhSiO$_{3/2}$)$_r$,
(HMe$_2$SiO$_{1/2}$)$_p$(PhSiO$_{3/2}$)$_q$(SiO$_{4/2}$)$_r$,
(HPh$_2$SiO$_{1/2}$)$_p$(PhSiO$_{3/2}$)$_q$,
(HMePhSiO$_{2/2}$)$_p$(PhSiO$_{3/2}$)$_q$,
(HMePhSiO$_{1/2}$)$_p$(Me$_2$SiO$_{2/2}$)$_q$(PhSiO$_{3/2}$)$_r$,
(HMePhSiO$_{1/2}$)$_p$(MePhSiO$_{2/2}$)$_q$(PhSiO$_{3/2}$)$_r$,
(HMePhSiO$_{1/2}$)$_p$(Ph$_2$SiO$_{2/2}$)$_q$(PhSiO$_{3/2}$)$_r$,
(HMePhSiO$_{1/2}$)$_p$(MeSiO$_{3/2}$)$_q$(PhSiO$_{3/2}$)$_r$,
(HMePhSiO$_{1/2}$)$_p$(PhSiO$_{3/2}$)$_q$(SiO$_{4/2}$)$_r$,
(HMePhSiO$_{1/2}$)$_p$(MeSiO$_{3/2}$)$_q$,
(HMe$_2$SiO$_{1/2}$)$_p$(PhSiO$_{3/2}$)$_q$,
(HMe$_2$SiO$_{1/2}$)$_p$(Me$_2$SiO$_{2/2}$)$_q$(PhSiO$_{3/2}$)$_r$,
(HMe$_2$SiO$_{1/2}$)$_p$(MePhSiO$_{2/2}$)$_q$(PhSiO$_{3/2}$)$_r$,
(HMe$_2$SiO$_{1/2}$)$_p$(Ph$_2$SiO$_{2/2}$)$_q$(PhSiO$_{3/2}$)$_r$,
(HMe$_2$SiO$_{1/2}$)$_p$(MeSiO$_{3/2}$)$_q$(PhSiO$_{3/2}$)$_r$,
(Me$_3$SiO$_{1/2}$)$_p$(MeHSiO$_{2/2}$)$_q$(PhSiO$_{3/2}$)$_r$,
(Me$_3$SiO$_{1/2}$)$_p$(HSiO$_{3/2}$)$_q$(PhSiO$_{3/2}$)$_r$,
(Me$_3$SiO$_{1/2}$)$_p$(MeHSiO$_{2/2}$)$_q$(PhSiO$_{3/2}$)$_r$,
(HMeSiO$_{2/2}$)$_p$(Me$_2$SiO$_{2/2}$)$_q$(PhSiO$_{3/2}$)$_r$,
(HMeSiO$_{2/2}$)$_p$(MePhSiO$_{2/2}$)$_q$(PhSiO$_{3/2}$)$_r$,
(HMeSiO$_{2/2}$)$_p$(Ph$_2$SiO$_{2/2}$)$_q$(PhSiO$_{3/2}$)$_r$,
(HMeSiO$_{2/2}$)$_p$(MeSiO$_{3/2}$)$_q$(PhSiO$_{3/2}$)$_r$,
(HMeSiO$_{2/2}$)$_p$(PhSiO$_{3/2}$)$_q$(SiO$_{4/2}$)$_r$,
(HMeSiO$_{2/2}$)$_p$(Me$_2$SiO$_{2/2}$)$_q$(PhSiO$_{3/2}$)$_r$,
(HMeSiO$_{2/2}$)$_p$(MePhSiO$_{2/2}$)$_q$(PhSiO$_{3/2}$)$_r$,
(HMeSiO$_{2/2}$)$_p$(Ph$_2$SiO$_{2/2}$)$_q$(PhSiO$_{3/2}$)$_r$,
(HMeSiO$_{2/2}$)$_p$(MeSiO$_{3/2}$)$_q$(PhSiO$_{3/2}$)$_r$,
(HMeSiO$_{2/2}$)$_p$(PhSiO$_{3/2}$)$_q$(SiO$_{4/2}$)$_r$,
(HMeSiO$_{2/2}$)$_p$(HSiO$_{3/2}$)$_q$(PhSiO$_{3/2}$)$_r$,
(HMeSiO$_{2/2}$)$_p$(HMeSiO$_{2/2}$)$_q$(PhSiO$_{3/2}$)$_r$,
(HMeSiO$_{2/2}$)$_p$(HMeSiO$_{2/2}$)$_q$(MeSiO$_{3/2}$)$_r$,
(HMeSiO$_{2/2}$)$_p$(HMeSiO$_{2/2}$)$_q$(MeSiO$_{3/2}$)$_r$(PhSiO$_{3/2}$)$_s$, or
a combination thereof.

In the formulas, n, m, l p, q, r and s are as described above.

Methods of preparing linear, branched, and cyclic polyorganosiloxanes suitable for use as component (I), such as hydrolysis of organohalosilanes or organoalkoxysilanes followed by condensation or equilibration, are well known in the art.

Component (II) Hydrogendiorganosiloxy Terminated Oligodiphenylsiloxane

Component (II) may comprise a hydrogendiorganosiloxy terminated oligodiphenylsiloxane having a molecular formula given as $HR^3{}_2SiO(SiPh_2O)_xSiR^3{}_2H$. Component (II) may be a single component or a combination comprising more than one hydrogendiorganosiloxy terminated oligodiphenylsiloxane. Each $R^3$ is independently a methyl group or a phenyl group. In formula each x is an integer from 2 to 8, and x averages from 2 to 4. Component (II) may comprise oligodiphenylsiloxanes such as $HMe_2SiO(SiPh_2O)_xSiMe_2H$,
$HMePhSiO(SiPh_2O)_xSiMePhH$, or
a combination thereof, where x is as described above.

Alternatively, component (II) may comprise an alkenyl-functional, diorganosiloxy-terminated oligodiphenylsiloxane having a molecular formula given as $R^1R^3{}_2SiO(SiPh_2O)_xSiR^3{}_2R^1$, where $R^1$, $R^3$, and x are as described above. The alkenyl-functional, diorganosiloxy-terminated oligodiphenylsiloxane may be a single component or a combination comprising more than one alkenyl-functional, diorganosiloxy-terminated oligodiphenylsiloxane. The alkenyl-functional, diorganosiloxy-terminated oligodiphenylsiloxane is exemplified by $ViMe_2SiO(SiPh_2O)_xSiMe_2Vi$,
$ViMePhSiO(SiPh_2O)_xSiMePhVi$, or
a combination thereof, where x is as described above.

Methods of preparing oligodiphenylsiloxanes suitable for use as component (II), such as hydrolysis and condensation of diphenyldichlorosilane or diphenylalkoxysilane followed by capping, are well known in the art.

Component (III) Hydrosilylation Catalyst

Component (III) is a hydrosilylation catalyst. Component (III) is added to the composition in an amount of 0.1 to 1000 ppm of platinum group metal, alternatively 1 to 500 ppm, alternatively 2 to 200, alternatively 5 to 150 ppm, based on the weight of the composition. Suitable hydrosilylation catalysts are known in the art and commercially available. Component (III) may comprise a platinum group metal selected from platinum, rhodium, ruthenium, palladium, osmium or iridium metal or organometallic compound thereof, or a combination thereof. Component (III) is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (III) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B.

Optional Components

An optional component may be added to the composition in addition to components (I)-(III). Suitable optional components include (IV) a co-crosslinker (V) an adhesion promoter, (VI) a filler, (VII) a treating agent, (VIII) an optically active agent, (IX) a cure modifier, (X) a rheology modifier, and a combination thereof.

Component (IV) Co-Crosslinker

Component (IV) is a co-crosslinker. Component (IV) may be added to the composition in an amount of 0.01 to 50 weight parts based on the weight of the composition, alternatively 0.01 to 25 weight parts, and alternatively 1 to 5 weight parts. Component (IV) may comprise a hydrogensilyl functional polyorganosiloxane having an average compositional formula given as $H_cR^4{}_dSiO_{(4-c-d)/2}$ other than component (II). Each $R^4$ is independently a methyl group or a phenyl group. At least 30 mol % of $R^4$ are phenyl groups. In the formula, a and b are positive numbers satisfying following equations: c+d=1 to 2.2 and c/(c+d)=0.001 to 0.05.

Component (V) Adhesion Promoter

Component (V) is an adhesion promoter. Component (V) may be added to the composition in an amount of 0.01 to 50 weight parts based on the weight of the composition, alternatively 0.01 to 10 weight parts, and alternatively 0.01 to 5 weight parts. Component (V) may comprise (i) an alkoxysilane, (ii) a combination of an alkoxysilane and a hydroxy-functional polyorganosiloxane, or (iii) a combination thereof, or a combination of component (V)(i), (ii) or (iii) with a transition metal chelate.

Alternatively, component (V) may comprise an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. Component (V) may comprise an unsaturated or epoxy-functional alkoxysilane. For example, the unsaturated or epoxy-functional alkoxysilane can have the formula $R^5{}_eSi(OR^6)_{(4-e)}$, where e is 1, 2, or 3, alternatively e is 1. Each $R^5$ is independently a monovalent organic group with the proviso that at least one $R^5$ is an unsaturated organic group or an epoxy-functional organic group. Epoxy-functional organic groups for $R^5$ are exemplified by 3-glycidoxypropyl and (epoxycyclohexyl)ethyl. Unsaturated organic groups for $R^5$ are exemplified by 3-methacryloyloxypropyl, 3-acryloyloxypropyl, and unsaturated monovalent hydrocarbon groups such as vinyl, allyl, hexenyl, undecylenyl. Each $R^6$ is independently an unsubstituted, saturated hydrocarbon group of 1 to 4 carbon atoms, alternatively 1 to 2 carbon atoms. $R^6$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Component (V) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Component (V) may comprise a combination of an epoxy-functional alkoxysilane and an epoxy-functional siloxane. For example, component (V) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer, or a mixture of 3-glycidoxypropyltrimethoxysilane and a hydroxy-terminated methylvinyl/methylphenylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and combinations thereof. Transition metal chelates and methods for their preparation are known in the art, see for example, U.S. Pat. No. 5,248,715, EP 0 493 791 A1, and EP 0 497 349 B1.

Component (VI) Filler

Component (VI) is a filler. The amount of component (VI) added to the composition depends on the type of filler selected and the resulting optical transparency. Component (VI) may be added to the composition in an amount of 0.1% to 50% based on the weight of the composition, alternatively 0.1% to 25%. Suitable fillers include reinforcing fillers such silica. Suitable reinforcing fillers are known in the art and commercially available, such as a fumed silica sold under the name CAB-O-SIL by Cabot Corporation of Massachusetts.

Conductive fillers (i.e., fillers that are thermally conductive, electrically conductive, or both) may also be used as component (VI). Suitable conductive fillers include metal particles, metal oxide particles, and a combination thereof. Suitable thermally conductive fillers are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the filler particles is not specifically restricted, however, rounded or spherical particles may prevent viscosity increase to an undesirable level upon high loading of the filler in the composition.

A combination of fillers having differing particle sizes and different particle size distributions may be used. For example, it may be desirable to combine a first filler having a larger average particle size with a second filler having a smaller average particle size in a proportion meeting the closest packing theory distribution curve. This may improve packing efficiency and may reduce viscosity and enhance heat transfer.

All or a portion of the filler may comprise spacers. Spacers can comprise organic particles such as polystyrene, inorganic particles such as glass, or a combination thereof. Spacers can be thermally conductive, electrically conductive, or both. Spacers can have a particle size of 25 micrometers to 250 micrometers. Spacers can comprise monodisperse beads. The amount of spacer depends on various factors including the distribution of particles, pressure to be applied during placement of the composition, and temperature of placement.

Component (VII) Treating Agent

The filler may optionally be surface treated with component (VII), a treating agent. Treating agents and treating methods are known in the art, see for example, U.S. Pat. No. 6,169,142 (col. 4, line 42 to col. 5, line 2). Component (VI) may be treated with the treating agent prior to combining component (VI) with the other components of the composition, or component (VI) may be treated in situ.

The treating agent can be an alkoxysilane having the formula: $R^7_f Si(OR^8)_{(4-f)}$, where f is 1, 2, or 3; alternatively f is 3. Each $R^7$ is independently a substituted or unsubstituted monovalent hydrocarbon group of 1 to 50 carbon atoms. $R^7$ is exemplified by alkyl groups such as hexyl, octyl, dodecyl, tetradecyl, hexadecyl, and octadecyl; and aromatic groups such as benzyl, phenyl and phenylethyl. $R^7$ can be saturated or unsaturated, branched or unbranched, and unsubstituted. $R^7$ can be saturated, unbranched, and unsubstituted.

Each $R^8$ is independently an unsubstituted, saturated hydrocarbon group of 1 to 4 carbon atoms, alternatively 1 to 2 carbon atoms. The treating agent is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treating agents. Alkoxy-functional oligosiloxanes and methods for their preparation are known in the art, see for example, EP 1 101 167 A2. For example, suitable alkoxy-functional oligosiloxanes include those of the formula $(R^9O)_g Si(OSiR^{10}_2 R^{11})_{4-g}$. In this formula, g is 1, 2, or 3, alternatively d is 3. Each $R^9$ can independently be an alkyl group. Each $R^{10}$ can be independently selected from saturated and unsaturated monovalent hydrocarbon groups of 1 to 10 carbon atoms. Each $R^{11}$ can be a saturated or unsaturated monovalent hydrocarbon group having at least 11 carbon atoms.

Metal fillers can be treated with alkylthiols such as octadecyl mercaptan and others, and fatty acids such as oleic acid, stearic acid, titanates, titanate coupling agents, zirconate coupling agents, and a combination thereof.

Treating agents for alumina or passivated aluminum nitride may include alkoxysilyl functional alkylmethyl polysiloxanes (e.g., partial hydrolysis condensate of $R^{12}_h R^{13}_i Si(OR^{14})_{(4-h-i)}$ or cohydrolysis condensates or mixtures), similar materials where the hydrolyzable group would be silazane, acyloxy or oximo. In all of these, a group tethered to Si, such as $R^{12}$ in the formula above, is a long chain unsaturated monovalent hydrocarbon or monovalent aromatic-functional hydrocarbon. Each $R^{13}$ is independently a monovalent hydrocarbon group, and each $R^{14}$ is independently a monovalent hydrocarbon group of 1 to 4 carbon atoms. In the formula above, h is 1, 2, or 3 and i is 0, 1, or 2, with the proviso that h+i is 1, 2, or 3. One skilled in the art could optimize a specific treatment to aid dispersion of the filler without undue experimentation.

Component (VIII) Optically Active Agent

Component (VIII) is an optically active agent. Examples of component (VIII) include optical diffusants, phosphor powders, photonic crystals, quantum dots, nanoparticles such as titanium dioxide nanoparticles or carbon nanotubes, dyes such as fluorescent dyes or absorbing dyes, and combinations thereof. The amount of component (VIII) depends on various factors including the optically active agent selected and the end use application. However, the amount of component (VIII) may range from 0.01% to 50% based on the weight of the composition, alternatively 1% to 10%.

Component (IX) Cure Modifier

Component (IX) is a cure modifier. Component (IX) can be added to extend the shelf life or working time, or both, of the composition of this invention. Component (IX) can be added to raise the curing temperature of the composition. Suitable cure modifiers are known in the art and are commercially available. Component (IX) is exemplified by acetylenic alcohols, cycloalkenylsiloxanes, eneyne compounds, triazoles phosphines; mercaptans, hydrazines, amines, fumarates, maleates, and combinations thereof. Examples of acetylenic alcohols are disclosed, for example, in EP 0 764 703 A2 and U.S. Pat. No. 5,449,802 and include methyl butynol, ethynyl cyclohexanol, dimethyl hexynol, 1-butyn-3-ol, 1-propyn-3-ol, 2-methyl-3-butyn-2-ol, 3-methyl-1-butyn-3-ol, 3-methyl-1-pentyn-3-ol, 3-phenyl-1-butyn-3-ol, 4-ethyl-1-octyn-3-ol, 3,5-dimethyl-1-hexyn-3-ol, and 1-ethynyl-1-cyclohexanol, and combinations thereof.

Examples of cycloalkenylsiloxanes include methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and combinations thereof. Examples of eneyne compounds include 3-methyl-3-penten-1-yne, 3,5-dimethyl-3-hexen-1-yne, and combinations thereof. Examples of triazoles include benzotriazole. Examples of phosphines include triphenylphosphine. Examples of amines include tetramethyl ethylenediamine. Examples of fumarates include dialkyl fumarates, dialkenyl fumarates, dialkoxyalkyl fumarates, and combinations thereof. Suitable cure modifiers are disclosed by, for example, U.S. Pat. Nos. 3,445,420; 3,989,667; 4,584,361; and 5,036,117.

Alternatively, component (IX) may comprise a silylated acetylenic inhibitor. Without wishing to be bound by theory, it is thought that adding a silylated acetylenic inhibitor reduces yellowing of the cured silicone product prepared from the composition of this invention as compared to a cured silicone product prepared from a hydrosilylation curable composition that does not contain an inhibitor or that contains an acetylenic alcohol. Suitable silylated acetylenic inhibitors may have the general formula (IX)(i):

or
general formula (IX)(ii):

or a combination thereof;
where each $R^{15}$ is independently a hydrogen atom or a monovalent organic group, $R^{16}$ is a covalent bond or a divalent hydrocarbon group, u is 0, 1, 2, or 3, t is 0 to 10, and v is 4 to 12. Alternatively u is 1 or 3. Alternatively, in general formula (IX)(i) u is 3. Alternatively, in general formula (IX)(ii), u is 1. Alternatively t is 0. Alternatively v is 5, 6, or 7, and alternatively v is 6. Examples of monovalent organic groups for $R^{15}$ include an aliphatically unsaturated organic group, an aromatic group, or a monovalent substituted or unsubstituted hydrocarbon group free of aromatics and free aliphatic unsaturation, as described above.

Silylated acetylenic inhibitors are exemplified by (3-methyl-1-butyn-3-oxy)trimethylsilane, ((1,1-dimethyl-2-propynyl)oxy)trimethylsilane, bis(3-methyl-1-butyn-3-oxy)dimethylsilane, bis(3-methyl-1-Butyn-3-oxy)silanemethylvinylsilane, bis((1,1-dimethyl-2-propynyl)oxy)dimethylsilane, methyl(tris(1,1-dimethyl-2-propynyloxy))silane, methyl(tris(3-methyl-1-butyn-3-oxy))silane, (3-methyl-1-butyn-3-oxy)dimethylphenylsilane, (3-methyl-1-butyn-3-oxy)dimethylhexenylsilane, (3-methyl-1-butyn-3-oxy)triethylsilane, bis(3-methyl-1-butyn-3-oxy)methyltrifluoropropylsilane, (3,5-dimethyl-1-hexyn-3-oxy)trimethylsilane, (3-phenyl-1-butyn-3-oxy)diphenylmethylsilane, (3-phenyl-1-butyn-3-oxy)dimethylphenylsilane, (3-phenyl-1-butyn-3-oxy)dimethylvinylsilane, (3-phenyl-1-butyn-3-oxy)dimethylhexenylsilane, (cyclohexyl-1-ethyn-1-oxy)dimethylhexenylsilane, (cyclohexyl-1-ethyn-1-oxy)dimethylvinylsilane, (cyclohexyl-1-ethyn-1-oxy)diphenylethylsilane, (cyclohexyl-1-ethyn-1-oxy)trimethylsilane, and combinations thereof. Alternatively, the silylated acetylenic inhibitor may comprise methyl(tris(1,1-dimethyl-2-propynyloxy))silane, ((1,1-dimethyl-2-propynyl)oxy)trimethylsilane, or a combination thereof.

Silylated acetylenic inhibitors may be prepared by methods known in the art for silylating an alcohol such as reacting a chlorosilane of formula $R^{15}{}_{u}SiCl_{4-u}$ with an acetylenic alcohol of formula in the presence of an acid receptor. In these formulae, u, t, v, $R^{15}$ and $R^{16}$ are as described above. Examples of silylated acetylenic inhibitors and methods for their preparation are disclosed, for example, in EP 0 764 703 A2 and U.S. Pat. No. 5,449,802. [0050] The amount of component (IX) added to the composition will depend on the particular cure modifier used, the nature and amount of component (III), and the composition of component (II). However, the amount of component (IX) may range from 0.001% to 10% based on the weight of the composition, alternatively 0.001% to 5%.

Component (X) Rheology Modifier

Component (X) is a rheology modifier. Rheology modifiers can be added to change the thixotropic properties of the composition. Component (X) is exemplified by flow control additives; reactive diluents; anti-settling agents; alpha-olefins; hydroxyl-terminated silicone-organic copolymers, including but not limited to hydroxyl-terminated polypropyleneoxide-dimethylsiloxane copolymers; and combinations thereof.

Other Optional Components

Other optional components may be added in addition to, or instead of, all or a portion of those described above, provided the optional component does not prevent the composition from curing to form a silicone product. Examples of other optional components include, but are not limited to, acid acceptors; anti-oxidants; stabilizers such as magnesium oxide, calcium hydroxide, metal salt additives such as those disclosed in EP 0 950 685 A1, heat stabilizers, and ultra-violet (UV) stabilizers; flame retardants; silylating agents, such as 4-(trimethylsilyloxy)-3-penten-2-one and N-(t-butyl dimethylsilyl)-N-methyltrifluoroacetamide; desiccants, such as zeolites, anhydrous aluminum sulfate, molecular sieves (preferably with a pore diameter of 10 Angstroms or less), kieselguhr, silica gel, and activated carbon; optical diffusants; colloidal silica; and blowing agents, such as water, methanol, ethanol, iso-propyl alcohol, benzyl alcohol, 1,4 butanediol, 1,5 pentanediol, 1,7 heptanediol, and silanols.

Overall SiH:Vi Ratio

The components in the composition may be selected such that the molar ratio of the total amount of silicon-bonded hydrogen atoms to aliphatically unsaturated groups in the composition ($SiH_{tot}/Vi_{tot}$) is greater than 0.5 and alternatively at least 0.8. $SiH_{tot}/Vi_{tot}$ may be up to 10.0, alternatively up to 5.0, and alternatively up to 3.0. Without wishing to be bound by theory, it is thought that if $SiH_{tot}/Vi_{tot}$ is too low, then the composition may not cure or may not adhere to some substrates, and there may be an increase in bleed from within the composition to other surfaces. Without wishing to be bound by theory, it is thought that if $SiH_{tot}/Vi_{tot}$ is too high, surface properties such as adhesion may be hindered and there may be an increase in bleed from within the composition to other surfaces.

Kits

The composition may be a one-part composition or a multiple-part composition such as a two-part composition. In a multiple-part composition, component (II) and optional component (IV), when present, are stored in a separate part from component (III). Any of components (I) and (V)-(VIII) can be added to either or both parts. One skilled in the art would know how to select components for each part without undue experimentation.

When a multiple part composition is prepared, it may be marketed as a kit. The kit may further comprise information or instructions or both as how to use the kit, how to combine the parts, or how to cure the resulting combination, or combinations thereof. For example, a kit comprising Part A and Part B can be prepared as follows.

Part A comprises:
(I) an alkenyl functional phenyl-containing polyorganosiloxane,
(III) a hydrosilylation catalyst,
optionally (V) an adhesion promoter,
optionally (VI) a filler,
optionally (VII) a treating agent,
optionally (VIII) a cure modifier, and
optionally (IX) a rheology modifier.

Part B comprises
optionally (I) an alkenyl functional phenyl-containing polyorganosiloxane,
(II) a hydrogendiorganosiloxy terminated oligodiphenylsiloxane,
optionally (IV) a co-crosslinker
optionally (V) an adhesion promoter
optionally (VI) a filler,
optionally (VII) a treating agent,
optionally (VIII) a cure modifier, and
optionally (IX) a rheology modifier.

Alternatively, a multiple part composition having Part A and Part B, may be prepared as follows. Part A comprises:
(II) an alkenyl-functional, diorganosiloxy-terminated oligodiphenylsiloxane having a molecular formula given as $R^1R^3_2SiO(SiPh_2O)_xSiR^3_2R^1$ where Ph represents a phenyl group, each $R^1$ is independently an alkenyl group having 2 to 12 carbon atoms, each $R^3$ is independently a methyl group or a phenyl group, x is an integer from 2 to 8, and x has an average value of 2 to 4,
(III) a hydrosilylation catalyst,
optionally (V) an adhesion promoter
optionally (VI) a filler,
optionally (VII) a treating agent,
optionally (VIII) a cure modifier, and
(IX) a rheology modifier.

Part B comprises:
(I) an Si—H functional, phenyl-containing polyorganosiloxane having an average compositional formula given as $H_aR^2_bSiO_{(4-a-b)/2}$ where each $R^2$ is independently a methyl group or a phenyl group, at least 30 mol % of $R^2$ are phenyl groups, a and b are positive numbers having values such that: a+b=1 to 2.2 and a/(a+b)=0.001 to 0.05;
optionally (II) an alkenyl-functional, diorganosiloxy-terminated oligodiphenylsiloxane having a molecular formula given as $R^1R^3_2SiO(SiPh_2O)_xSiR^3_2R^1$ where Ph represents a phenyl group, each $R^1$ is independently an alkenyl group having 2 to 12 carbon atoms, each $R^3$ is independently a methyl group or a phenyl group, x is an integer from 2 to 8, and x has an average value of 2 to 4,
optionally (IV) a co-crosslinker;
optionally (V) an adhesion promoter;
optionally (VI) a filler;
optionally (VII) a treating agent;
optionally (VIII) a cure modifier; and
optionally (IX) a rheology modifier.

The kit may further comprise instructions for mixing Part A and Part B together in a weight ratio. Part A and Part B can be mixed together in a ratio of Part A:Part B (A:B) of 0.05:1 to 20:1, alternatively 0.1:1 to 10:1, alternatively 1:1 to 5:1.

Method of Making the Composition

The compositions described above can be prepared by mixing the components by any convenient means. For example, the composition can be prepared by mixing all components at ambient temperature. The mixer used is not specifically restricted and will be determined by the viscosity of the components and the composition. Suitable mixers include but are not limited to kneader type sigma blade mixers, double planetary mixers, non-intrusive mixers such as those reliant on centrifugal motion, and two- and three-roll rubber mills. The compositions may optionally be filtered after mixing. One skilled in the art would be able to prepare the composition without undue experimentation by the methods disclosed above and in the examples set forth below.

Light Emitting Device

The composition of this invention is useful for a range of applications where optically transmissive properties or adhesion properties or mechanical properties, or both, are desired. For example, the compositions described above cure to form an optically clear material with high adhesion strength and mechanical properties.

Cured silicone products prepared using the compositions of this invention can vary in properties from rigid resins to elastomers to gels, depending upon various factors including the types and concentrations of components (I) and (II) and any optional components that are added to the composition. The cured silicone products are preferably soft elastomers or gels. Cured products prepared using the compositions are useful in end-use applications as encapsulants or as coatings.

Encapsulation or coating techniques for light emitting devices in the present invention are well known to the art and may be used in the present invention. Such techniques comprise casting, dispensing, molding, and the like. For example, after the light emitting device is enveloped in the uncured composition, typically performed in a mold, the composition is cured. These compositions may be cured in one or more stages by heating. For example, cure may be performed at temperatures in one embodiment ranging from room temperature to 200° C.

The light emitting devices withstand against thermal shock from soldering condition and thermal and light exposure under light emitting condition. For example, transmittance loss of the cured material at 400 nanometers (nm) is smaller than 10% after soldering at 260° C. for 5 minutes (Test-1). The cured composition show neither delamination nor fracture during the soldering process. The similar stability is also observed from following reliability test condition with lighting; a 500 thermal cycle between −40° C. and 120° C. (Test-2), exposure at 85° C./85% relative humidity for 1000 hours (Test-3) and exposure at 150° C. for 1000 hours (Test-4).

EXAMPLES

These examples illustrate the invention to one of ordinary skill in the art and are not intended to limit the scope of the invention set forth in the claims.

Reference Example 1

Preparation of $HMe_2SiO(Ph_2SiO)_2SiMe_2H$

In a 4-necked 1 L flask fitted with a thermometer, mechanical stirrer, nitrogen gas inlet tube, and condenser, 735.6 grams (g) diphenyldimethoxysilane, 45.2 g acetic acid, and 670 milligrams (mg) trifluoromethanesulfonic acid were placed under nitrogen. Then the reaction mixture was warmed up to 55° C. over 40 minutes (min). After heating for 80 min, the reaction was quenched with addition of 4.5 g calcium carbonate. The reaction mixture was evaporated to give 60 g of clear oil. It was purified by a recrystallization from n-hexane to yield a pure $MeO(Ph_2SiO)_2Me$.

In a 4-necked 0.5-L flask fitted with a thermometer, a mechanical stirrer, pressure equalized dropping funnel, and condenser, 128 g $MeO(Ph_2SiO)_2Me$, 73.8 g 1,1,3,3-hexamethyldisiloxane, and 34.7 g acetic acid were placed under nitrogen. To dissolve the alkoxysilane, 100 ml toluene was added to the flask, and then, 267 mg trifluoromethanesulfonic acid was added to the reaction mixture. The reaction mixture was warmed up at 50° C. After aging at 50° C. for 45 minutes, 28.1 g acetic anhydride was added slowly to the reaction mixture over a 30 min period. After the addition, the reaction mixture was kept standing at 40-50° C. for 2 hours (h). After cooling to 25° C., the reaction mixture was transferred to a 1-1 separation funnel with 170 ml toluene. The organic layer was washed 6 times with 50 milliliters (ml) of water in each time. The residual organic layer was evaporated to yield 153 g colorless liquid.

Reference Example 2

Preparation of $HMe_2SiO(Ph_2SiO)_{2.5}SiMe_2H$

In a 4-necked 2-L flask equipped with a thermometer, mechanical stirrer, pressure equalized dropping funnel, and condenser, 977.6 g diphenyldimethoxysilane, 1.497 g trifluoromethanesulfonic acid, and 144 g acetic acid were placed in this order under nitrogen. After the reaction mixture was warmed to 42° C., the reaction temperature gradually raised to 64° C. during 15 min without any heating. After the reaction temperature was decreased to 62° C. (20 minutes later), the reaction mixture was refluxed for 15 min. The mixture was evaporated to yield a crude intermediate $MeO(Ph_2SiO)_{2.5}OMe$ as a mixture still containing trifluoromethanesulfonic acid.

To the above residue, 258 g 1,1,3,3-tetramethyldisiloxane was added. After the mixture was warmed at 50° C., 192 g acetic acid was added slowly to the mixture maintaining the pot temperature at 49-51° C. After the addition, the reaction temperature was maintained at 50° C. for 5 min. To the reaction mixture, 163 g acetic anhydride was added slowly to maintain the temperature at 48-52° C. with aid of a water bath. After the addition was completed, the reaction mixture was kept standing at 50° C. to 51° C. for 45 min. After cooling to room temperature, the reaction mixture was transferred to a 2-1 separation funnel with 200 ml heptane. The organic layer was washed 6 times with 50 ml of water in each time. The residual organic layer was evaporated to yield 1005 g colorless liquid. Using diphenyldimethoxysilane, trifluoromethanesulfonic acid, acetic acid, and acetic anhydride, $HMe_2SiO(Ph_2SiO)_{2.5}SiMe_2H$ is prepared.

Reference Example 3

Characterization of Composition and Cured Composition

A composition was characterized by its viscosity at 25° C. and refractive index of 587 nm light at 25° C. The cured silicone product prepared by heating the composition at 150° C. for 1 min an oven was characterized by its transmittance at 400 nm with 10 mm light path length and durometer A or D hardness.

Reference Example 4

Preparation of Light Emitting Device

Figure 1:
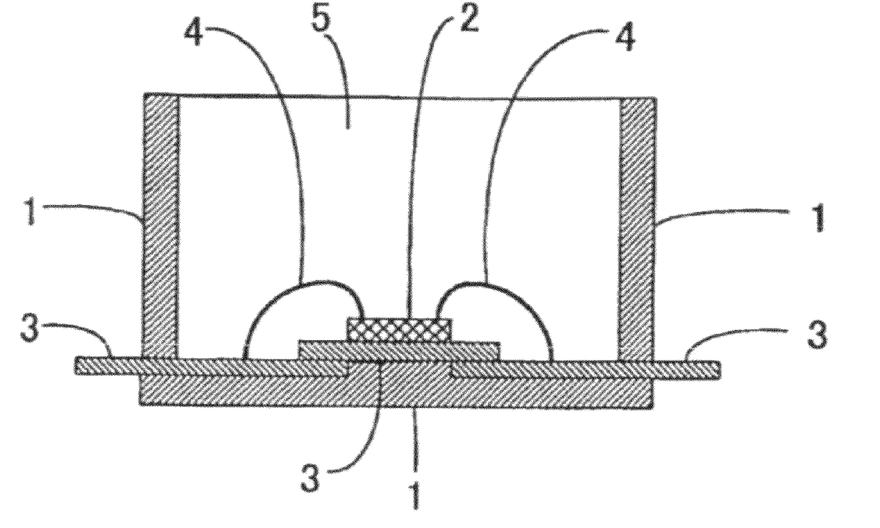
FIG. 1 is a cross-section image of light emitting device

A light emitting diode device shown in FIG. 1 was prepared as follows. A GaN compound semiconductor (LED) chip 2 was placed in a polyphthalamide (PPA) case 1 and die bonded to an inner lead 3 portion of a lead frame with electroconductive paste, and then the semiconductor chip was wire bonded with gold wire 4. A silicone composition as described herein was coated on the semiconductor chip followed by cure at 150° C. for 1 hour in an oven to form a cured silicone 5.

Reference Example 5

Reliability Test of Light Emitting Device

Samples for % transmission testing were prepared according to reference example 3, and the samples were separately exposed to following conditions; (1) heating at 260° C. for 5 min on a hot plate, (2) heating at 150° C. for 100 h in an oven, (3) heating at 85° C. under 85% relative humidity for 100 h, and (4) applying a 500 thermal cycle test between −40° C. and 100° C., and (5) heating at 150° C. for 1000 h. Samples were also prepared according to reference example 4 and exposed to the same conditions. After the exposures, appearance of the encapsulant was observed with microscope in term of delamination, fracture, or the other deformation. % Transmission before and after the exposures were measured, and relative output values based on the initial output value as 100 were obtained.

Example 1

Curable Silicone Composition of the Invention

A mixture of $ViMe_2SiO(SiMePhO)_{20}SiMe_2Vi$ (44.11%), $ViMe_2SiO(SiMePhO)_4SiMe_2Vi$ (8.22%), $(ViMe_2SiO_{1/2})_{0.15}(MePhSiO_{2/2})_{0.40}(PhSiO_{3/2})_{0.45}$ (28.78%), and $HMe_2SiO(SiPh_2O)_{2.5}SiMe_2H$ (21.89%), was prepared by mixing the components. Addition of 0.38 parts Catalyst, which is a mixture of 90% 1,3-diethenyl-1,1,3,3-tetramethyldisiloxane and 10% 1,3-diethenyl-1,1,3,3-tetramethyldisiloxane complexes with platinum, said mixture having a platinum content of 4.0%, 1.0 parts a hydroxy-terminated poly(dimethylsiloxane/methylvinylsiloxane) with (glycidoxypropyl)trimethoxysilane as Adhesion Promoter, and 0.05 parts ethyl cyclohexanol as Cure Modifier to 100 parts of the above mixture yielded a clear composition.

Example 2

Curable Silicone Composition of the Invention

A mixture of $ViMe_2SiO(SiMePhO)_{44}(SiMeViO)_{1.2}SiMe_2Vi$, $(ViMe_2SiO_{1/2})_{0.25}(PhSiO_{3/2})_{0.75}$, $HMe_2SiO(SiPh_2O)_{2.5}SiMe_2H$, and $PhSi(OSiMe_2H)_3$ in ratio of 40.0:31.1:27.9:1.0 was prepared by mixing the components. Addition of 0.005 parts Catalyst, which is a mixture of 90% 1,3-diethenyl-1,1,3,3-tetratnethyldisiloxane and 10% 1,3-diethenyl-1,1,3,3-tetramethyldisiloxane complexes with platinum, said mixture having a platinum content of 5.0%, 0.1 parts a hydroxy-terminated poly(methylphenylsiloxane/methylvinylsiloxane) with (glycidoxypropyl)trimethoxysilane as Adhesion Promoter, and 0.01 parts ethynylcyclohexan-1-ol as Cure Modifier to 100 parts of the above mixture yielded a clear composition.

Example 3

Curable Silicone Composition of the Invention

A mixture of $(ViMe_2SiO_{1/2})_{0.25}(PhSiO_{3/2})_{0.75}$, $Ph_2Si(OSiMe_2Vi)_2$, $PhSi(OSiMe_2Vi)_3$, and $HMe_2SiO(SiPh_2O)_2SiMe_2H$ in ratio of 51.5:2.5:2.5:43.5 was prepared by mixing the components. Addition of 0.01 parts Catalyst, which is a mixture of 90% 1,3-diethenyl-1,1,3,3-tetramethyldisiloxane and 10% 1,3-diethenyl-1,1,3,3-tetramethyldisiloxane complexes with platinum, said mixture having a platinum content of 5.0%, and 0.05 parts ethynylcyclohexan-1-ol as Cure Modifier to 100 parts of the above mixture yielded a clear composition.

Comparative Example 1

Curable Silicone Composition

A mixture of $ViMe_2SiO(SiMePhO)_{20}SiMe_2Vi$ (37.54%), $ViMe_2SiO(SiMePhO)_4SiMe_2Vi$ (6.11%), $(ViMe_2SiO_{1/2})_{0.15}(MePhSiO_{2/2})_{0.40}(PhSiO_{3/2})_{0.45}$ (43.65%), and $Ph_2Si(OSiMe_2H)_2$ (12.7%) was prepared by mixing the components. Addition of 0.38 parts Catalyst, which is a mixture of 90% 1,3-diethenyl-1,1,3,3-tetramethyldisiloxane and 10% 1,3-diethenyl-1,1,3,3-tetramethyldisiloxane complexes with platinum, said mixture having a platinum content of 4.0%, as Adhesion Promoter, and 0.05 parts ethynyl cyclohexanol as Cure Modifier to 100 parts of the above mixture yielded a clear composition.

Comparative Example 2

Curable Silicone Composition

A mixture of $ViMe_2SiO(SiMePhO)_{50}SiMe_2Vi$, $(ViMe_2SiO_{1/2})_{0.25}(PhSiO_{3/2})_{0.75}$, and $HMe_2SiO(SiPh_2O)_4SiMe_2H$ in ratio of 44.4:36.3:19.4 was prepared by mixing the components. Addition of 0.005 parts Catalyst, which is a mixture of 90% 1,3-diethenyl-1,1,3,3-tetramethyldisiloxane and 10% 1,3-diethenyl-1,1,3,3-tetramethyldisiloxane complexes with platinum, said mixture having a platinum content of 5.0%, 0.1 parts a hydroxy-terminated poly(methylphenylsiloxane/methylvinylsiloxane) with (glycidoxypropyl)trimethoxysilane as Adhesion Promoter, and 0.01 parts ethynylcyclohexan-1-ol as Cure Modifier to 100 parts of the above mixture yielded a clear composition.

Comparative Example 3

Curable Silicone Composition

A mixture of $(ViMe_2SiO_{1/2})_{0.25}(PhSiO_{3/2})_{0.75}$, $Ph_2Si(OSiMe_2Vi)_2$, and $Ph_2Si(OSiMe_2H)_2$ in ratio of 69.5:2.8:27.7 was prepared by mixing the components. Addition of 0.01 parts Catalyst, which is a mixture of 90% 1,3-diethenyl-1,1,3,3-tetramethyldisiloxane and 10% 1,3-diethenyl-1,1,3,3-tetrarnethyldisiloxane complexes with platinum, said mixture having a platinum content of 5.0%, and 0.05 parts ethynylcyclohexan-1-ol as Cure Modifier to 100 parts of the above mixture yielded a clear composition.

The compositions in examples 1-3 and comparative examples 1-3 were evaluated according to reference examples 3-5. The results are in Table 1.

Example 4

A mixture of $ViMe_2SiO(MePhSiO_{2/2})_{19}SiMe_2Vi$ (54.84%), $ViMe_2SiO(MePhSiO_{2/2})_{75}SiMe_2Vi$ (20.72%), $(ViMe_2SiO_{1/2})_{0.25}(PhSiO_{3/2})_{0.75}$ (7.28%), $(PhSiO_{3/2})_{0.4}(Me_2HSiO_{1/2})_{0.6}$ (0.51%) and $HMe_2SiO(Ph_2SiO_{2/2})_{2.5}SiMe_2H$ (15.48%), was prepared by mixing the components. Addition of 0.77 parts Catalyst, which is a mixture of 99% $ViMe_2SiO(SiMePhO)_{19}SiMe_2Vi$, 0.38% 1,3-diethenyl-1,1,3,3-tetramethyldisiloxane, and 0.62% 1,3-diethenyl-1,1,3,3-tetramethyldisiloxane complexes with platinum, said mixture having a platinum content of 25.0%, and 0.39 parts inhibitor which is a mixture of 99% $ViMe_2SiO(SiMePhO)_{19}SiMe_2Vi$ and 1% 1-ethynyl-1-cyclohexanol as Cure Modifier to 100 parts of the above mixture yielded a clear composition. The composition was evaluated according to test (5) in reference example 5. The results are in Table 2.

TABLE 1

|  | Example 1 | Example 2 | Example 3 | Comparative example 1 | Comparative example 2 | Comparative example 3 |
|---|---|---|---|---|---|---|
| Viscosity (mPa · s) | 2,000 | 2,000 | 3,300 | 1,600 | 1,700 | 1,150 |
| Refractive index | 1.5495 | 1.546 | 1.545 | 1.53 | 1.540 | 1.531 |
| Durometer OO Hardness | 45 | — | — | 40 | — | — |
| Durometer A hardness | — | 50 | — | — | 50 | — |
| Durometer D hardness | — | — | 45 | — | — | 55 |
| Tensile strength (MPa) | — | 1.11 | — | — | 0.57 | — |
| Elongation at break (%) | — | 81 | — | — | 56 | — |

TABLE 1-continued

|  | Example 1 | Example 2 | Example 3 | Comparative example 1 | Comparative example 2 | Comparative example 3 |
|---|---|---|---|---|---|---|
| Test 1 Appearance/ % Transmission | No change/100% | No change/100% | No change/99% | No change/96% | No change/98% | Delamination/75% |
| Test 2 Appearance/ % Transmission | No change/99% | No change/99% | No change/97% | Fractured/56% | Delamination/60% | Delamination/55% |
| Test 3 Appearance/ % Transmission | No change/100% | No change/99% | No change/98% | Fractured/60% | Delamination/65% | Delamination/65% |
| Test 4 Appearance/ % Transmission | No change/95% | No change/93% | No change/92% | Fractured/30% | Delamination/45% | Delamination/30% |

TABLE 2

|  | Example 4 |
|---|---|
| Viscosity (mPa · s) | 4,505 |
| Refractive index at 633 nm | 1.5494 |
| Durometer OO Hardness | 45 |
| Durometer A hardness | — |
| Durometer D hardness | — |
| Tensile strength (MPa) | — |
| Elongation at break (%) | — |
| Test 5 Appearance | No change |
| Test 5 Device defects | 0% |

| Reference Numerals | |
|---|---|
| 1 | Case |
| 2 | LED chip |
| 3 | Inner lead |
| 4 | Wire |
| 5 | Cured silicone |

The invention claimed is:

1. A composition prepared by mixing components comprising:
    (I) an alkenyl functional, phenyl-containing polyorganosiloxane having an average compositional formula given as $R^1{}_aR^2{}_bSiO_{(4-a-b)/2}$ where $R^1$ is an alkenyl group having 2 to 12 carbon atoms, each $R^2$ is independently a methyl group or a phenyl group, at least 30 mol % of $R^2$ are phenyl groups, a and b are positive numbers having values such that: a+b=1 to 2.2 and a/(a+b)=0.001 to 0.05;
    (II) a hydrogendiorganosiloxy terminated oligodiphenylsiloxane having a molecular formula given as $HR^3{}_2SiO(SiPh_2O)_xSiR^3{}_2H$ where Ph represents a phenyl group, each $R^3$ is independently a methyl group or a phenyl group, x is an integer from 2 to 8, and x has an average value of 2 to 4; and
    (III) a hydrosilylation catalyst.

2. The composition of claim 1, where component (I) is selected from:
ViMe$_2$SiO(SiMePhO)$_n$SiMe$_2$Vi,
ViMe$_2$SiO(SiPh$_2$O)$_n$SiMe$_2$Vi,
ViMe$_2$SiO(SiMe$_2$O)$_n$(SiMePhO)$_m$SiMe$_2$Vi,
ViMe$_2$SiO(SiMe$_2$O)$_n$(SiPh$_2$O)$_m$SiMe$_2$Vi,
HexMe$_2$SiO(SiMePhO)$_n$SiMe$_2$Hex,
HexMe$_2$SiO(SiPh$_2$O)$_n$SiMe$_2$Hex,
HexMe$_2$SiO(SiMe$_2$O)$_n$(SiMePhO)$_m$SiMe$_2$Hex,
HexMe$_2$SiO(SiMe$_2$O)$_n$(SiPh$_2$O)$_m$SiMe$_2$Hex,
ViMePhSiO(SiMePhO)$_n$SiMePhVi,
ViMePhSiO(SiPh$_2$O)$_n$SiMePhVi,
ViMePhSiO(SiMe$_2$O)$_n$(SiMePhO)$_m$SiMePhVi,
ViMePhSiO(SiMe$_2$O)$_n$(SiPh$_2$O)$_m$SiMePhVi,
ViMe$_2$SiO(SiMePhO)$_n$(SiMeViO)$_m$SiMe$_2$Vi,
ViMe$_2$SiO(SiMe$_2$O)$_n$(SiMePhO)$_m$(SiMeViO)$_1$SiMe$_2$Vi,
ViMe$_2$SiO(SiMe$_2$O)$_n$(SiPh$_2$O)$_m$(SiMeViO)$_1$SiMe$_2$Vi,
ViMePhSiO(SiMePhO)$_n$(SiMeViO)$_m$SiMePhVi,
ViMePhSiO(SiMe$_2$O)$_n$(SiMePhO)$_m$(SiMeViO)$_1$SiMePhVi,
ViMePhSiO(SiMe$_2$O)$_n$(SiPh$_2$O)$_m$(SiMeViO)$_1$SiMePhVi,
Me$_3$SiO(SiMePhO)$_n$(SiMeViO)$_m$SiMe$_3$,
Me$_3$SiO(SiMe$_2$O)$_n$(SiMePhO)$_m$(SiMeViO)$_1$SiMe$_3$,
Me$_3$SiO(SiMe$_2$O)$_n$(SiPh$_2$O)$_m$(SiMeViO)$_1$SiMe$_3$,
Me$_3$SiO(SiMePhO)$_n$(SiMeHexO)$_m$SiMe$_3$,
Me$_3$SiO(SiMe$_2$O)$_n$(SiMePhO)$_m$(SiMeHexO)$_1$SiMe$_3$,
Me$_3$SiO(SiMe$_2$O)$_n$(SiPh$_2$O)$_m$(SiMeHexO)$_1$SiMe$_3$,
(ViMe$_2$SiO$_{1/2}$)$_p$(PhSiO$_{3/2}$)$_q$,
(ViMe$_2$SiO$_{1/2}$)$_p$(Me$_2$SiO$_{2/2}$)$_q$(PhSiO$_{3/2}$)$_r$,
(ViMe$_2$SiO$_{1/2}$)$_p$(MePhSiO$_{2/2}$)$_q$(PhSiO$_{3/2}$)$_r$,
(ViMe$_2$SiO$_{1/2}$)$_p$(Ph$_2$SiO$_{2/2}$)$_q$(PhSiO$_{3/2}$)$_r$,
(ViMe$_2$SiO$_{1/2}$)$_p$(MeSiO$_{3/2}$)$_q$(PhSiO$_{3/2}$)$_r$,
(ViMe$_2$SiO$_{1/2}$)$_p$(PhSiO$_{3/2}$)$_q$(SiO$_{4/2}$)$_r$,
(HexMePhSiO$_{1/2}$)$_p$(PhSiO$_{3/2}$)$_q$,
(ViMePhSiO$_{1/2}$)$_p$(PhSiO$_{3/2}$)$_q$,
(ViMePhSiO$_{1/2}$)$_p$(Me$_2$SiO$_{2/2}$)$_q$(PhSiO$_{3/2}$)$_r$,
(ViMePhSiO$_{1/2}$)$_p$(MePhSiO$_{2/2}$)$_q$(PhSiO$_{3/2}$)$_r$,
(ViMePhSiO$_{1/2}$)$_p$(Ph$_2$SiO$_{2/2}$)$_q$(PhSiO$_{3/2}$)$_r$,
(ViMePhSiO$_{1/2}$)$_p$(MeSiO$_{3/2}$)$_q$(PhSiO$_{3/2}$)$_r$,
(ViMePhSiO$_{1/2}$)$_p$(PhSiO$_{3/2}$)$_q$(SiO$_{4/2}$)$_r$,
(ViMePhSiO$_{1/2}$)$_p$(PhSiO$_{3/2}$)$_q$,
(HexMe$_2$SiO$_{1/2}$)$_p$(PhSiO$_{3/2}$)$_q$,
(HexMe$_2$SiO$_{1/2}$)$_p$(Me$_2$SiO$_{2/2}$)$_q$(PhSiO$_{3/2}$)$_r$,
(HexMe$_2$SiO$_{1/2}$)$_p$(MePhSiO$_{2/2}$)$_q$(PhSiO$_{3/2}$)$_r$,
(HexMe$_2$SiO$_{1/2}$)$_p$(Ph$_2$SiO$_{2/2}$)$_q$(PhSiO$_{3/2}$)$_r$,
(HexMe$_2$SiO$_{1/2}$)$_p$(MeSiO$_{3/2}$)$_q$(PhSiO$_{3/2}$)$_r$,
(Me$_3$SiO$_{1/2}$)$_p$(MeViSiO$_{2/2}$)$_q$(PhSiO$_{3/2}$)$_r$,
(Me$_3$SiO$_{1/2}$)$_p$(ViSiO$_{3/2}$)$_q$(PhSiO$_{3/2}$)$_r$,
(Me$_3$SiO$_{1/2}$)$_p$(MeViSiO$_{2/2}$)$_q$(PhSiO$_{3/2}$)$_r$,
(ViMeSiO$_{2/2}$)$_p$(Me$_2$SiO$_{2/2}$)$_q$(PhSiO$_{3/2}$)$_r$,
(ViMeSiO$_{2/2}$)$_p$(MePhSiO$_{2/2}$)$_q$(PhSiO$_{3/2}$)$_r$,
(ViMeSiO$_{2/2}$)$_p$(Ph$_2$SiO$_{2/2}$)$_q$(PhSiO$_{3/2}$)$_r$,
(ViMeSiO$_{2/2}$)$_p$(MeSiO$_{3/2}$)$_q$(PhSiO$_{3/2}$)$_r$,
(ViMeSiO$_{2/2}$)$_p$(PhSiO$_{3/2}$)$_q$(SiO$_{4/2}$)$_r$,
(ViMeSiO$_{2/2}$)$_p$(Me$_2$SiO$_{2/2}$)$_q$(PhSiO$_{3/2}$)$_r$,
(ViMeSiO$_{2/2}$)$_p$(MePhSiO$_{2/2}$)$_q$(PhSiO$_{3/2}$)$_r$,
(HexMeSiO$_{2/2}$)$_p$(Ph$_2$SiO$_{2/2}$)$_q$(PhSiO$_{3/2}$)$_r$,
(HexMeSiO$_{2/2}$)$_p$(MeSiO$_{3/2}$)$_q$(PhSiO$_{3/2}$)$_r$,
(HexMeSiO$_{2/2}$)$_p$(PhSiO$_{3/2}$)$_q$(SiO$_{4/2}$)$_r$, or
a combination thereof,
where n, m, l are positive numbers less than 200 that mean the average number of each monomer unit; and p, q, r, and s mean the average mol percentages of each monomer unit.

3. The composition of claim 2, further comprising a component selected from: (IV) a co-crosslinker (V) an adhesion promoter, (VI) a filler, (VII) treating agent, (VIII) an optically active agent, (IX) a cure modifier, (X) a rheology modifier, or a combination thereof.

4. A silicone product prepared by curing the composition of claim 2.

5. The composition of claim 1, where the composition contains 0.1% to 35% branched alkenyl functional, phenyl-containing polyorganosiloxane based on the weight of the composition.

6. The composition of claim 5, further comprising a component selected from: (IV) a co-crosslinker (V) an adhesion promoter, (VI) a filler, (VII) treating agent, (VIII) an optically active agent, (IX) a cure modifier, (X) a rheology modifier, or a combination thereof.

7. A silicone product prepared by curing the composition of claim 5.

8. The composition of claim 1, where component (II) is selected from:
HMe$_2$SiO(SiPh$_2$O)$_x$SiMe$_2$H,
HMePhSiO(SiPh$_2$O)$_x$SiMePhH, or
a combination thereof.

9. The composition of claim 8, further comprising a component selected from: (IV) a co-crosslinker (V) an adhesion promoter, (VI) a filler, (VII) treating agent, (VIII) an optically active agent, (IX) a cure modifier, (X) a rheology modifier, or a combination thereof.

10. A silicone product prepared by curing the composition of claim 8.

11. The composition of claim 1, further comprising a component selected from: (IV) a co-crosslinker (V) an adhesion promoter, (VI) a filler, (VII) treating agent, (VIII) an optically active agent, (IX) a cure modifier, (X) a rheology modifier, or a combination thereof.

12. A silicone product prepared by curing the composition claim 1.

13. A device comprising:
i) a semiconductor chip,
ii) a lead frame;
iii) a wire bonding the semiconductor chip to the lead frame, and
iv) the silicone product of claim 12 coated over the semiconductor chip.

14. The device of claim 13, where the semiconductor chip is light emitting.

15. A composition prepared by mixing components comprising:
(I) an Si—H functional, phenyl-containing polyorganosiloxane having an average compositional formula given as H$_a$R$^2_b$SiO$_{(4-a-b)/2}$ where each R$^2$ is independently a methyl group or a phenyl group, at least 30 mol % of R$^2$ are phenyl groups, a and b are positive numbers having values such that: a+b=1 to 2.2 and a/(a+b)=0.001 to 0.05;
(II) an alkenyl-functional, diorganosiloxy-terminated oligodiphenylsiloxane having a molecular formula given as R$^1$R$^3_2$SiO(SiPh$_2$O)$_x$SiR$^3_2$R where Ph represents a phenyl group, each R$^1$ is independently an alkenyl group having 2 to 12 carbon atoms, each R$^3$ is independently a methyl group or a phenyl group, x is an integer from 2 to 8, and x has an average value of 2 to 4; and
(III) a hydrosilylation catalyst.

16. A multiple part composition having Part A and Part B, where
Part A comprises:
(I) an alkenyl functional, phenyl-containing polyorganosiloxane having an average compositional formula given as R$^1_a$R$^2_b$SiO$_{(4-a-b)/2}$ where R$^1$ is an alkenyl group having 2 to 12 carbon atoms, each R$^2$ is independently a methyl group or a phenyl group, at least 30 mol % of R$^2$ are phenyl groups, a and b are positive numbers having values such that: a+b=1 to 2.2 and a/(a+b)=0.001 to 0.05;
(III) a hydrosilylation catalyst,
optionally (V) an adhesion promoter
optionally (VI) a filler,
optionally (VII) a treating agent,
optionally (VIII) a cure modifier, and
(IX) a rheology modifier;
Part B comprises
optionally (I) the alkenyl functional phenyl-containing polyorganosiloxane,
(II) a hydrogendiorganosiloxy terminated oligodiphenylsiloxane having a molecular formula given as HR$^3_2$SiO(SiPh$_2$O)$_x$SiR$^3_2$H where Ph represents a phenyl group, each R$^3$ is independently a methyl group or a phenyl group, x is an integer from 2 to 8, and x has an average value of 2 to 4;
optionally (IV) a co-crosslinker;
optionally (V) an adhesion promoter;
optionally (VI) a filler;
optionally (VII) a treating agent;
optionally (VIII) a cure modifier; and
optionally (IX) a rheology modifier.

17. The kit of claim 16, further comprising instructions for mixing Part A and Part B together in a weight ratio of Part A:Part B of 0.05:1 to 20:1.

18. A multiple part composition having Part A and Part B, where
Part A comprises:
(II) an alkenyl-functional, diorganosiloxy-terminated oligodiphenylsiloxane having a molecular formula given as R$^1$R$^3_2$SiO(SiPh$_2$O)$_x$SiR$^3_2$R$^1$ where Ph represents a phenyl group, each R$^1$ is independently an alkenyl group having 2 to 12 carbon atoms, each R$^3$ is independently a methyl group or a phenyl group, x is an integer from 2 to 8, and x has an average value of 2 to 4,
(III) a hydrosilylation catalyst,
optionally (V) an adhesion promoter
optionally (VI) a filler,
optionally (VII) a treating agent,
optionally (VIII) a cure modifier, and
(IX) a rheology modifier;
Part B comprises
(I) an Si—H functional, phenyl-containing polyorganosiloxane having an average compositional formula given as H$_a$R$^2_b$SiO$_{(4-a-b)/2}$ where each R$^2$ is independently a methyl group or a phenyl group, at least 30 mol % of R$^2$ are phenyl groups, a and b are positive numbers having values such that: a+b=1 to 2.2 and a/(a+b)=0.001 to 0.05;
optionally (II) an alkenyl-functional, diorganosiloxy-terminated oligodiphenylsiloxane having a molecular formula given as R$^1$R$^3_2$SiO(SiPh$_2$O)$_x$SiR$^3_2$R$^1$ where Ph represents a phenyl group, each R$^1$ is independently an alkenyl group having 2 to 12 carbon atoms, each R$^3$ is independently a methyl group or a phenyl group, x is an integer from 2 to 8, and x has an average value of 2 to 4,
optionally (IV) a co-crosslinker;
optionally (V) an adhesion promoter;
optionally (VI) a filler;
optionally (VII) a treating agent;
optionally (VIII) a cure modifier; and
optionally (IX) a rheology modifier.

19. The kit of claim 18, further comprising instructions for mixing Part A and Part B together in a weight ratio of Part A:Part B of 0.05:1 to 20:1.

* * * * *